(12) United States Patent
Prall

(10) Patent No.: US 6,835,619 B2
(45) Date of Patent: Dec. 28, 2004

(54) METHOD OF FORMING A MEMORY TRANSISTOR COMPRISING A SCHOTTKY CONTACT

(75) Inventor: Kirk D. Prall, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 54 days.

(21) Appl. No.: 10/215,898

(22) Filed: Aug. 8, 2002

(65) Prior Publication Data

US 2004/0029322 A1 Feb. 12, 2004

(51) Int. Cl.$^7$ ............................................. H01L 21/336
(52) U.S. Cl. ........................ 438/257; 438/581; 438/264
(58) Field of Search ................................ 438/257, 167, 438/169, 581–583, 201, 211, 261–264, 162; 257/315, 316, 267

(56) References Cited

U.S. PATENT DOCUMENTS

| | | | |
|---|---|---|---|
| 5,990,509 A | | 11/1999 | Burns, Jr. et al. |
| 6,141,248 A | * | 10/2000 | Forbes et al. .......... 365/185.08 |
| 6,144,093 A | | 11/2000 | Davis et al. |
| 6,303,479 B1 | * | 10/2001 | Snyder ........................ 438/581 |
| 6,320,223 B1 | | 11/2001 | Hueting et al. |
| 6,331,467 B1 | | 12/2001 | Brown et al. |
| 2002/0163032 A1 | * | 11/2002 | Lin et al. .................... 257/315 |

FOREIGN PATENT DOCUMENTS

| | | | | |
|---|---|---|---|---|
| JP | 2001007229 | * | 1/2001 | |
| JP | 2001007229 A | * | 1/2001 | ....... H01L/21/8247 |

OTHER PUBLICATIONS

Cho et al., "High Performance SONOS Memory Cells Free of Drain Turn–On and Over–Erase: Compatibility Issue with Current Flash Technology", IEEE, pp. 399–401, Aug. 2000.*

Wolf et al., "Oxidic Field Effect Structures With Memory", Material Res. Soc., Xv+562 pp., 1996.*

Standards Committee of The IEEE Electron Devices Society, "IEEE Standard Definitions and Charactirization of Floating Gate Semiconductor Arrays", IEEE 1005–1998, pp. 45–52, Jun. 1998.*

Schulz, et al., "Short–Channel Vertical sidewall MOSFETs," © 2001 IEEE, pp. 1783–1788.

Versari, et al., "Optimized Programming of Multilevel Flash EEPROMs," © 2001 IEEE, pp. 1641–1646.

Cho et al., "High Performance SONOS Memory Cells Free of Drain Turn–On and Over–Erase: Compatibility Issue with Current Flash technology," © 2001 IEEE, pp. 399–401.

Standards Committee of the IEEE Electron Devices Society, "IEEE Standard Definitions and Characterization of Floating Gate Semiconductor Arrays," © 1999 IEEE, cover page and pp. 46–52.

Van Houdt et al., "Analysis of the Enhanced Hot–Electron Injection in Split–Gate Transistors Useful for EEPROM Applications," © 1992 IEEE, pp. 1150–1156.

Milnes, D.Sc., A.G., "Semiconductor Devices and Integrated Electronics," © 1980 by A.G. Milnes, 3 pages—only.

* cited by examiner

*Primary Examiner*—Craig A. Thompson
(74) *Attorney, Agent, or Firm*—Wells St. John P.S.

(57) ABSTRACT

A method of forming a memory transistor includes providing a substrate comprising semiconductive material and forming spaced-apart source/drain structures. At least one of the source/drain structures forms a Schottky contact to the semiconductive material. The method also includes forming a memory gate between the spaced-apart source/drain structures and forming a control gate disposed operatively over the memory gate.

30 Claims, 1 Drawing Sheet

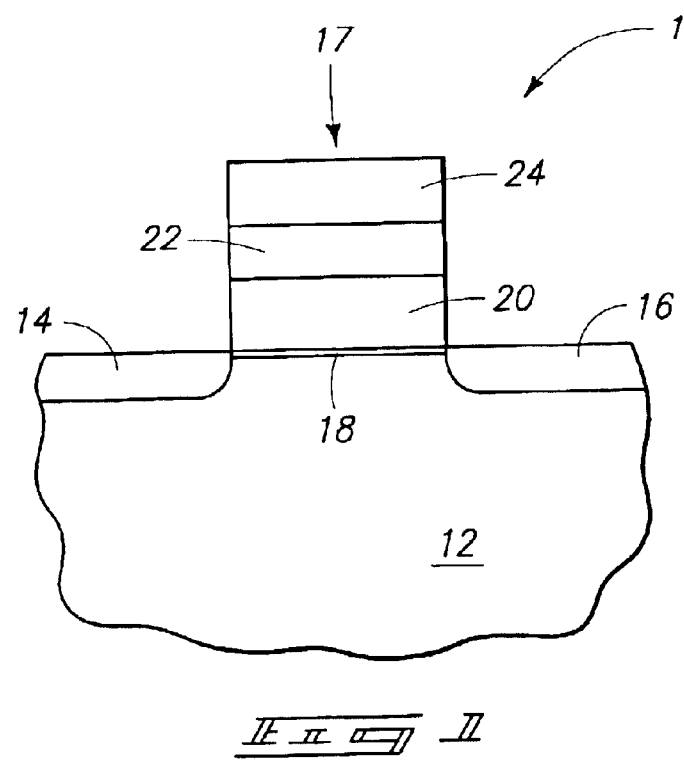
F I G. 1
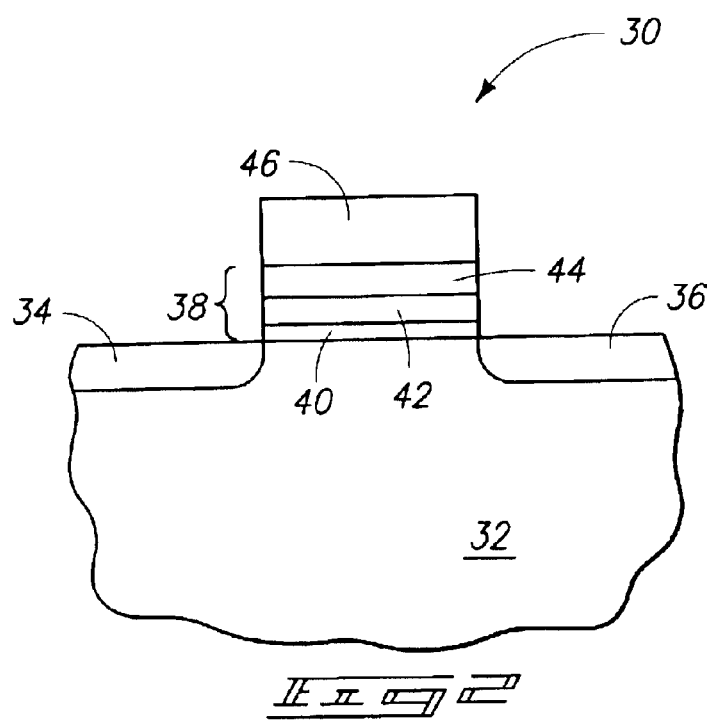
F I G. 2

METHOD OF FORMING A MEMORY TRANSISTOR COMPRISING A SCHOTTKY CONTACT

TECHNICAL FIELD

The present invention relates to non-volatile memory transistors employing hot carrier injection, arrays of such memory transistors, electronic devices employing such memory transistors and methods related to such memory transistors.

BACKGROUND OF THE INVENTION

Various types of memory devices are used in electronic systems. Some types of memory device, such as DRAM (dynamic random access memory) provide large amounts of readable and writable data storage with modest power budget and in favorably small form factor, but are not as fast as other types of memory devices and provide volatile data storage capability.

Volatile data storage means that the memory must be continuously powered in order to retain data, and the stored data are lost when the power is interrupted. Nonvolatile memories are capable of retaining data without requiring electrical power.

Other types of memory can provide read-only or read-write capabilities and non-volatile data storage, but are much slower in operation. These include CD-ROM devices, CD-WORM devices, magnetic data storage devices (hard discs, floppy discs, tapes and the like), magneto-optical devices and the like.

Still other types of memory provide very high speed operation but also demand high power budgets. Static RAM or SRAM is an example of such memory devices.

In most computer systems, different memory types are blended to gain the benefits that each technology can offer. For example, read-only memories or ROM, EEPROM and the like are typically used to store limited amounts of infrequently-accessed data such as a basic input-output system. These memories are employed to store data that, in response to a power ON situation, configure a processor to be able to load larger amounts of software such as an operating system from a high capacity non-volatile memory device such as a hard drive. The operating system and application software are typically read from the high capacity memory and corresponding images are stored in DRAM.

As the processor executes instructions, some types of data may be repeatedly fetched. As a result, some SRAM or other high speed memory is typically provided as "cache" memory in conjunction with the processor and may be included on the processor chip or very near it.

Several different kinds of memory device are involved in most modern computing devices, and in many types of appliances that include automated and/or programmable features (home entertainment devices, telecommunications devices, automotive control systems etc.). As system and software complexity increase, need for memory increases. Desire for portability, computation power and/or practicality result in increased pressure to reduce both power consumption and circuit area per bit. Modern computing devices employ relatively large amounts of DRAMs for temporary data storage.

However, because DRAMs are volatile memories, they require "refresh" operations. In a refresh operation, data are read out of each memory cell, amplified and written back into the DRAM. As a first result, the DRAM circuit is usually not available for other kinds of memory operations during the refresh operation. Additionally, refresh operations are carried out periodically, resulting in periods during which data cannot be readily extracted from or written to DRAMs. As a second result, some amount of electrical power is always needed to store data in DRAM devices.

As a third result, boot operations for computers such as personal computers involve a period during which the computer cannot be used following power ON operation. During this period, operating system instructions and data, and application instructions and data, are read from relatively slow, non-volatile memory, such as a conventional disc drive, are decoded by the processing unit and the resultant instructions and data are loaded into modules incorporating relatively rapidly-accessible, but volatile, memory such as DRAM. Other consequences flow from the properties of the memory systems included in various electronic devices and the increasingly complex software employed with them, however, these examples serve to illustrate ongoing needs.

Flash memory devices have been developed to address some of these concerns. Flash memory devices typically employ a floating gate and operate by creating "hot" charge carriers that are then injected through an insulator into the floating gate. Alternatively, the "hot" charge carriers may be injected into and trapped within a suitable dielectric medium. These kinds of devices typically are combined with an MOS structure to enable the data to be read out of the device.

Problems that are encountered with such devices include relatively low injection efficiency, latch-up phenomena and/or silicon-on-insulator (SOI) floating-body effects. As device geometries are scaled to smaller and smaller sizes, need increases for reducing channel or ON resistance, reducing parasitic capacitance and reducing short-channel effects in such devices.

Needed are methods and apparatus relating to non-volatile memory providing high a real data storage capacity, reprogrammability, low power consumption and relatively high data access speed, coupled with reduced ON resistance, improved charge carrier injection efficiency and reduced short-channel effects.

SUMMARY OF THE INVENTION

In one aspect, the invention includes a method of forming a memory transistor includes providing a substrate comprising semiconductive material and forming spaced-apart source/drain structures. At least one of the source/drain structures forms a Schottky contact to the semiconductive material. The method also includes forming a memory gate between the spaced-apart source/drain structures and forming a control gate disposed operatively over the memory gate.

In one aspect, the invention includes a memory transistor structure. The memory transistor structure includes a substrate comprising semiconductive material and spaced-apart source/drain structures. At least one of the source/drain structures includes a Schottky contact to the semiconductive material. The memory transistor structure includes a memory gate disposed between the spaced-apart source/drain structures and a control gate disposed operatively over the memory gate.

BRIEF DESCRIPTION OF THE DRAWINGS

Embodiments of the invention are described below with reference to the following accompanying drawings.

FIG. 1 is a simplified side view, in section, of a Schottky source electrode memory cell incorporating a floating gate, in accordance with an embodiment of the present invention.

FIG. 2 is a simplified side view, in section, of a Schottky source electrode memory cell incorporating a SONOS gate structure, in accordance with an embodiment of the present invention.

DETAILED DESCRIPTION

This disclosure of embodiments in accordance with the present invention is submitted in furtherance of the constitutional purposes of the U.S. Patent Laws "to promote the progress of science and useful arts" (Article 1, Section 8).

Many kinds of memory cells are typically built on a semiconductor substrate. Such memory cells typically include metal-oxide-semiconductor field effect transistors (MOS FETs). Schottky source side injection mechanisms in MOS FET structures have been created using cobalt silicide Schottky source contacts, as is described, for example, in "Enhancement of Hot-Electron Generation Rate In Schottky Source Metal-Oxide-Semiconductor Field Effect Transistors", by K. Uchida et al., Applied Physics Letters, Vol. 76, No. 26, Jun. 26, 2000, pp. 3992–4.

Dual gate structures for hot electron generation have been employed in electrically erasable memory cells, as is described, for example, in "Analysis Of The Hot-Electron Injection In Split-Gate Transistors Useful For EEPROM Applications", by J. van Houdt et al. (IEEE Trans. El. Dev., Vol. 39, No. 5, May 1992, pp. 1150–1156, IEEE Cat. No. 0018-9383).

However, split gate structures involve increased process complexity and increased cell size. Conventional NOR memory cells provide advantages of small cell size with simplicity in processing. Such NOR memory cells are described, for example, in "IEEE Standard Definitions And Characterization of Floating Gate Semiconductor Arrays", IEEE Cat. No. 1005-1998 (inst. of Elect. and Electr. Engrs., 345 E. 47$^{th}$ St., New York N.Y. 10017-2394, USA, copyright 1999). A description of a T-cell flash EEPROM cell, also known as a NOR cell, begins on p. 46. Such cells can be made to be extremely compact.

It would be advantageous to combine the benefits of efficient hot carrier source side injection with the benefits of conventional NOR memory cell simplicity. It has been discovered that one way to achieve such is by combining a Schottky source electrode with a charge storage gate electrode structure.

FIG. 1 is a simplified side view, in section, of a Schottky source electrode memory transistor 10 formed on a semiconductive substrate 12, in accordance with an embodiment of the present invention. As used herein, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

The memory transistor 10 includes a Schottky source/drain contact 14 and another source/drain contact 16 respectively disposed on opposing edges of a memory gate 17.

In one embodiment, both source/drain contacts 14, 16 are Schottky contacts. In one embodiment, at least one of the source/drain contacts 14, 16 forms a hole-conductive Schottky contact. In one embodiment, at least one of the source/drain contacts 14, 16 forms an electron-conductive Schottky contact. In one embodiment, one of the source/drain contacts 14, 16 is a conventional diffused or implanted ohmic contact while the other is a Schottky contact. In one embodiment, one or both of the source/drain contacts 14, 16 is spaced apart from the memory gate structure 17. In one embodiment, at least one of the source/drain contacts 14, 16 comprises a cobalt silicide Schottky contact. In one embodiment, at least one of the source/drain contacts 14, 16, comprises a material taken from Table I below.

TABLE I

Schottky contact barrier heights on p- and n-type silicon (from "Semiconductor Devices and Integrated Electronics", A. G. Milnes, Van Nostrand Reinhold Co., copyright 1980, p. 100).

| Metal | $\phi_m$ (eV) | $\phi_{Bp}$ (eV) | $\phi_{Bn}$ (eV) | $\phi_{Bp} + \phi_{Bn}$ (eV) |
|---|---|---|---|---|
| Au | 4.8 | 0.34 | 0.81 | 1.15 |
| Ni | 4.5 | 0.50 | 0.66 | 1.16 |
| Cu | 4.4 | 0.46 | 0.69 | 1.14 |
| Ag | 4.3 | 0.53 | 0.69 | 1.22 |
| Al | 4.25 | 0.57 | 0.68 | 1.25 |
| Pb | 4.0 | 0.54 | 0.6 | 1.14 |
| Hf | 3.5 | 0.63 | — | — |
| CoSi | — | 0.38 | 0.68 | 1.06 |

In one embodiment, the memory gate structure 17 includes a first gate dielectric 18. In one embodiment, a conventional gate dielectric formed by oxidation of semiconductor material forms the first gate dielectric 18.

In one embodiment, the memory gate structure 17 also includes a conductive gate 20 formed atop the first gate dielectric 18. In one embodiment, the conductive gate 20 is formed from conventional polycrystalline silicon or polysilicon.

In one embodiment, the memory gate structure 17 includes a second gate dielectric 22 formed atop the conductive gate 20 by any conventional process. In one embodiment, the memory gate structure 17 further includes a control gate 24. In one embodiment, the control gate 24 comprises conductive material. In one embodiment, the control gate 24 comprises conventional polycrystalline silicon.

In operation, the memory transistor 10 is programmed by application of suitable biases to the control gate 24 and the source/drain contacts 14, 16. As a result, a known amount of charge is transferred into the conductive gate structure 20. However, in the memory transistor 10, such charge transfer is effectuated via hot charge carriers and with efficiencies of up to four orders of magnitude greater than previous devices. In turn, such permits data storage with greatly reduced total power consumption. This promotes increased operating life of the memory transistor 10.

The memory transistor 10 may be programmed to any of multiple charge storage states, in accordance with conventional flash memory device practices. As a result, it is possible to store more than one bit in each of memory transistors 10. The memory transistor 10 may also be "deprogrammed" by application of suitable biases in known fashions.

FIG. 2 is a simplified side view, in section, of a Schottky source/drain electrode memory transistor 30 formed on a semiconductive substrate 32, in accordance with an embodiment of the present invention. The memory transistor 30 includes source/drain contacts 34, 36, analogous to source/drain contacts 14, 16 of FIG. 1.

In one embodiment, a SONOS gate dielectric 38 is formed between the source/drain electrodes 34, 36. A SONOS gate dielectric 38 typically includes multiple dielectric layers 40, 42, 44. For example, such a SONOS gate dielectric may comprise Silicon (e.g., substrate 32), Oxide (e.g., dielectric layer 40), Nitride (e.g., dielectric layer 42) and Oxide (e.g., dielectric layer 44). A conductive gate 46 is formed thereatop, and such may comprise Silicon, providing a conventional SONOS structure.

In operation, hot charge carriers are injected into the SONOS gate dielectric 38 and are trapped within the middle dielectric layer 42. Again, multiple recognizably different charge states may be so programmed. The memory transistor 30 differs from the memory transistor 10 of FIG. 1 in that spatially distinct charge distribution patterns are possible. For example, one set of bias conditions results in charge carriers being preferentially stored in the gate dielectric 38 adjacent source/drain contact 34, while a different set of bias conditions results in charge carriers being stored adjacent source/drain contact 36. These options are not mutually exclusive, and, as a result, a minimum of four measurably distinct charge storage patterns are possible in each memory transistor 30. Again, conventional bias techniques allow deprogramming of each memory transistor 30. Additionally, flash memory techniques allow discrimination between different quantities of charge that may be stored in each location.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a memory transistor, comprising:
   providing a substrate comprising semiconductive material; forming spaced-apart source/drain structures, at least one of the source/drain structures comprising a Schottky contact to the semiconductive material;
   forming a charge storage gate between the spaced-apart source/drain structures, the memory transistor being configured to be programmed to a plurality of distinct charge storage states, wherein biasing the memory transistor to first bias conditions produces the charge carriers stored in the charge storage gate adjacent one of the source/drain structures, and biasing the memory transistors to second different bias conditions produces the charge carriers stored in the charge storage gate adjacent another of the source/drain structures; and
   forming a control gate disposed operatively over the charge storage gate.

2. The method of claim 1, wherein forming a charge storage gate comprises:
   forming a SONOS structure; and
   forming the control gate atop the SONOS structure.

3. The method of claim 1, wherein forming a charge storage gate comprises:
   forming a SONOS structure; and
   forming the control gate to comprise polysilicon disposed atop the SONOS structure.

4. The method of claim 1, wherein forming a charge storage gate comprises forming a polysilicon floating gate and wherein the control gate comprises polysilicon disposed atop the floating gate and separated therefrom by a dielectric material.

5. The method of claim 1, wherein forming a charge storage gate comprises forming a conductive floating gate and wherein the control gate comprises conductive material disposed atop the conductive floating gate and separated therefrom by a dielectric material.

6. The method of claim 1, wherein the Schottky contact is to p-type material.

7. The method of claim 1, wherein forming spaced-apart source/drain structures comprises forming Schottky contacts to p-type material.

8. The method of claim 1, wherein forming spaced-apart source/drain structures comprises forming Schottky contacts.

9. The method of claim 1, wherein forming spaced-apart source/drain structures comprises forming Schottky contacts to n-type semiconductor material.

10. The method of claim 1, wherein forming spaced-apart source/drain structures comprises forming at least one Schottky contact to n-type semiconductor material.

11. A method of forming a memory transistor, comprising:
    providing a substrate comprising semiconductive material;
    forming spaced-apart source/drain structures, at least one of the source/drain structures comprising a Schottky contact to the semiconductive material;
    forming a charge storage gate between the spaced-apart source/drain structures by forming a SONOS structure, the charge storage gate having a first oxide layer, a second oxide layer, and a nitride layer sandwiched between the first and second oxide layers, wherein charge carriers injected into the charge storage gate are trapped in the nitride layer thereby enabling the memory transistor to be programmed to a plurality of distinct charge storage states, and further wherein the charge storage states include spatially distinct charge distribution patterns; and forming a control gate disposed operatively over the SONOS structure.

12. The method of claim 11, wherein forming a charge storage gate comprises disposing polysilicon atop the SONOS structure.

13. A method of forming a memory transistor, comprising:
    providing a substrate comprising semiconductive material;
    forming spaced-apart source/drain structures, at least one of the source/drain structures comprising a Schottky contact to the semiconductive material, wherein the Schottky contact is to p-type material;
    forming a charge storage gate between the spaced-apart source/drain structures by forming a polysilicon floating gate, the charge storage gate having a first oxide layer, a second oxide layer, and a nitride layer sandwiched between the first and second oxide layers, wherein charge carriers injected into the charge storage gate are trapped in the nitride layer which enables the memory transistor to be programmed to at least four distinct charge storage states, and further wherein the charge storage states include spatially distinct charge distribution patterns; and
    forming a control gate disposed operatively over the floating gate and separated from the floating gate by a dielectric material, wherein biasing the memory transistor to first bias conditions produces the charge carriers stored in the charge storage gate adjacent one of the source/drain structures, and biasing the memory transistors to second different bias conditions produces the charge carriers stored in the charge storage gate adjacent another of the source/drain structures.

14. The method of claim 13, wherein forming spaced-apart source/drain structures comprises forming Schottky contacts to p-type material.

15. The method of claim 13, wherein forming spaced-apart source/drain structures comprises forming Schottky contacts to n-type semiconductor material.

16. The method of claim 13, wherein forming spaced-apart source/drain structures comprises forming at least one Schottky contact to n-type semiconductor material.

17. A method of forming a memory transistor, comprising:
providing a substrate comprising semiconductive material;
forming spaced-apart source/drain structures, at least one of the source/drain structures comprising a Schottky contact to the semiconductive material;
forming a charge storage gate between the spaced-apart source/drain structures by forming a SONOS structure, the charge storage gate having a first oxide layer, a second oxide layer, and a nitride layer sandwiched between the first and second oxide layers, wherein charge carriers injected into the charge storage gate are trapped in the nitride layer thereby enabling the memory transistor to be programmed to a plurality of distinct charge storage states, and further wherein the memory transistor is configured to store more than 1-bit of information; and
forming a control gate disposed operatively over the SONOS structure.

18. The method of claim 17, wherein at least one of the source/drain structures comprise at least one of Au, Ni, Cu, As, Al, Pb, Hf, CoSi.

19. A method of forming a memory transistor, comprising:
providing a substrate comprising semiconductive material;
forming spaced-apart source/drain structures, at least one of the source/drain structures including a Schottky contact to the semiconductive material, and the other of the source/drain structures including an ohmic contact to the semiconductive material;
forming a charge storage gate between the spaced-apart source/drain structures, the charge storage gate having a first oxide layer, a second oxide layer, and a nitride layer sandwiched between the first and second oxide layers, wherein charge carriers injected into the charge storage gate are trapped in the nitride layer thereby enabling the memory transistor to be programmed to a plurality of distinct charge storage states; and
forming a control gate disposed operatively over the charge storage gate.

20. The method of claim 19, wherein forming spaced-apart source/drain structures comprises forming Schottky contacts to p-type material.

21. The method of claim 19, wherein forming spaced-apart source/drain structures comprises forming Schottky contacts to n-type semiconductor material.

22. The method of claim 19, wherein forming spaced-apart source/drain structures comprises forming at least one Schottky contact to n-type semiconductor material.

23. A method of forming a memory transistor, comprising:
forming spaced-apart source/drain structures, at least one of the source/drain structures including a Schottky contact and the other of the source/drain structures including an ohmic contact to a substrate;
forming a charge storage gate between the spaced-apart source/drain structures; and
forming a control gate disposed operatively over the charge storage gate, wherein biasing the memory transistor to different bias conditions selectively produces charge carriers in the charge storage gate adjacent different one of the source/drain structures.

24. The method of claim 23, wherein forming spaced-apart source/drain structures comprises forming Schottky contacts to p-type material.

25. The method of claim 23, wherein forming spaced-apart source/drain structures comprises forming Schottky contacts to n-type semiconductor material.

26. The method of claim 23, wherein forming spaced-apart source/drain structures comprises forming at least one Schottky contact to n-type semiconductor material.

27. A method of forming a memory transistor, comprising:
forming spaced-apart source/drain structures, at least one of the source/drain structures including a Schottky contact to a substrate;
forming a charge storage gate between the spaced-apart source/drain structures; and
forming a control gate disposed operatively over the charge storage gate, wherein biasing the memory transistor to distinct bias conditions produces charge carriers in the charge storage gate adjacent distinct one of the source/drain structures.

28. The method of claim 27, wherein forming spaced-apart source/drain structures comprises forming Schottky contacts to p-type material.

29. The method of claim 27, wherein forming spaced-apart source/drain structures comprises forming Schottky contacts to n-type semiconductor material.

30. The method of claim 27, wherein forming spaced apart source/drain structures comprises forming at least one Schottky contact to n-type semiconductor material.

* * * * *

UNITED STATES PATENT AND TRADEMARK OFFICE
CERTIFICATE OF CORRECTION

PATENT NO. : 6,835,619 B2
DATED : December 28, 2004
INVENTOR(S) : Prall

It is certified that error appears in the above-identified patent and that said Letters Patent is hereby corrected as shown below:

Title page,
Item [56], References Cited, FOREIGN PATENT DOCUMENTS, delete
"JP    2001007229    *    1/2001";
OTHER PUBLICATIONS, delete
"Cho et al., "High Performance SONOS Memory Cells Free of Drain Turn-On and Over-Erase; Compatibility Issue With Current Flash Technology:, IEEE, pp. 399-401, Aug. 2000.".

Column 3,
Line 29, please delete "EI." after "Trans." and insert -- El. --.

Signed and Sealed this

Twenty-fifth Day of October, 2005

JON W. DUDAS
*Director of the United States Patent and Trademark Office*